US010516416B2

(12) United States Patent
Eckardt et al.

(10) Patent No.: US 10,516,416 B2
(45) Date of Patent: Dec. 24, 2019

(54) METHOD AND RELATED MOBILE DEVICE FOR FAST BLIND DECODING

(71) Applicant: Intel IP Corporation, Santa Clara, CA (US)

(72) Inventors: Florian Eckardt, Dresden (DE); Zhibin Yu, Unterhaching (DE)

(73) Assignee: Intel IP Corporation, Santa Clara, CA (US)

( * ) Notice: Subject to any disclaimer, the term of this patent is extended or adjusted under 35 U.S.C. 154(b) by 19 days.

(21) Appl. No.: 15/738,077

(22) PCT Filed: May 18, 2016

(86) PCT No.: PCT/US2016/032958
§ 371 (c)(1),
(2) Date: Dec. 19, 2017

(87) PCT Pub. No.: WO2017/011069
PCT Pub. Date: Jan. 19, 2017

(65) Prior Publication Data
US 2018/0234112 A1    Aug. 16, 2018

(30) Foreign Application Priority Data
Jul. 16, 2015  (DE) .......................... 10 2015 111 565

(51) Int. Cl.
*H03M 13/09* (2006.01)
*H04L 1/00* (2006.01)
(Continued)

(52) U.S. Cl.
CPC ....... *H03M 13/09* (2013.01); *H03M 13/3738* (2013.01); *H03M 13/41* (2013.01);
(Continued)

(58) Field of Classification Search
CPC .. H03M 13/09; H03M 13/3738; H03M 13/41; H04L 1/00; H04L 1/0046; H04L 1/0061
(Continued)

(56) References Cited

U.S. PATENT DOCUMENTS 8,416,891 B2 * 4/2013 Mansson .............. H04B 7/0689
                                                                342/463
8,588,347 B1 * 11/2013 Petrovic ................... H04L 1/08
                                                                375/340
(Continued)

FOREIGN PATENT DOCUMENTS

WO    WO-2012105795 A2    8/2012
WO    WO-2017011069 A1    1/2017

OTHER PUBLICATIONS

"International Application Serial No. PCT/US2016/032958, International Search Report dated Aug. 8, 2016", 3 pgs.
(Continued)

*Primary Examiner* — John J Tabone, Jr.
(74) *Attorney, Agent, or Firm* — Schwegman Lundberg & Woessner, P.A.

(57) ABSTRACT

The present disclosure relates to a method for blind decoding a signal in a decoder of a mobile device. The method comprises receiving a channel coded signal; testing a plurality of hypotheses for the decoder that are not related to channel decoding by decoding the channel coded signal to generate a hypothesis specific decoded, channel coded signal and correlating a local channel coded reference sequence against a presumed corresponding section of the hypothesis specific decoded, channel coded signal for each of the plurality of hypotheses to generate a plurality of test results. The method further comprises determining a best hypothesis based on the plurality of test results and channel decoding a
(Continued)

hypothesis specific decoded, channel coded signal for the best hypothesis to generate a channel decoded signal.

21 Claims, 5 Drawing Sheets

(51) Int. Cl.
*H03M 13/37* (2006.01)
*H03M 13/41* (2006.01)

(52) U.S. Cl.
CPC .............. *H04L 1/00* (2013.01); *H04L 1/0046* (2013.01); *H04L 1/0061* (2013.01)

(58) Field of Classification Search
USPC .................................. 714/758, 776; 375/224
See application file for complete search history.

(56) References Cited

U.S. PATENT DOCUMENTS

| | | | | |
|---|---|---|---|---|
| 8,627,171 B2* | 1/2014 | Pi | .......................... | H03M 13/09 370/241 |
| 2009/0141690 A1* | 6/2009 | Fan | ........................ | H04L 1/0026 370/335 |
| 2010/0074448 A1* | 3/2010 | Park | ......................... | H04J 13/00 380/287 |
| 2010/0322132 A1* | 12/2010 | Ramakrishna | ........ | H04L 1/0038 370/312 |
| 2010/0322158 A1* | 12/2010 | Lee | ......................... | H04L 5/001 370/329 |
| 2011/0013730 A1 | 1/2011 | Mansson et al. | | |
| 2011/0164707 A1 | 7/2011 | Luo et al. | | |
| 2011/0182385 A1* | 7/2011 | Doan | ................ | H03M 13/3738 375/340 |
| 2012/0320782 A1* | 12/2012 | Seo | ........................ | H04L 1/1854 370/252 |
| 2013/0265927 A1 | 10/2013 | Joung et al. | | |
| 2014/0301296 A1 | 10/2014 | Vos et al. | | |
| 2016/0227525 A1* | 8/2016 | Werner | ..................... | H04L 1/00 |

OTHER PUBLICATIONS

"International Application Serial No. PCT/US2016/032958, Written Opinion dated Aug. 8, 2016", 7 pgs.

* cited by examiner

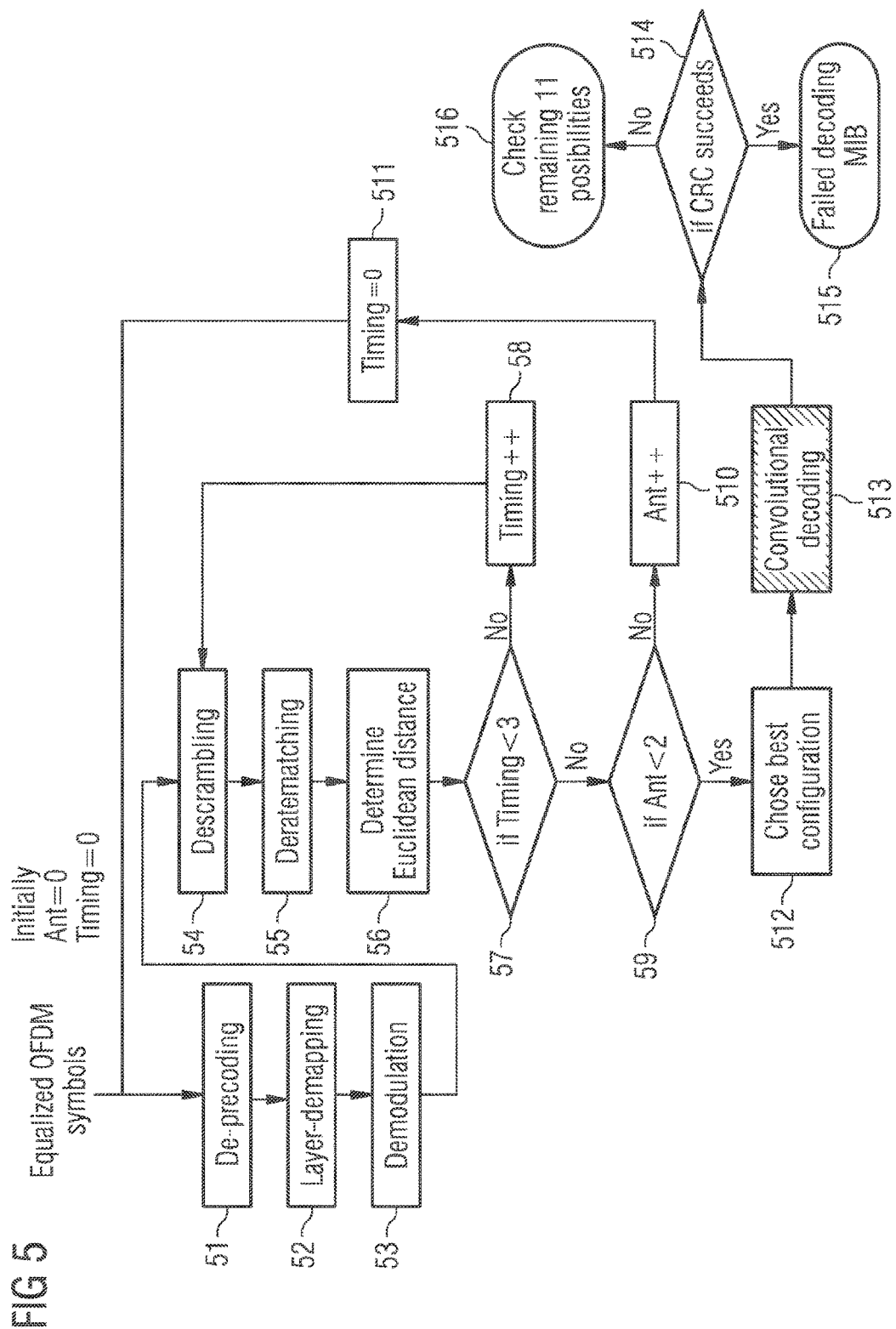

US 10,516,416 B2

METHOD AND RELATED MOBILE DEVICE FOR FAST BLIND DECODING

CROSS-REFERENCE TO RELATED APPLICATION

This application is a U.S. National Stage Filing under 35 U.S.C. 371 from International Application No. PCT/US2016/032958, filed on May 18, 2016, now published as WO 2017/011069, which claims priority to German Patent Application No. 102015111565.4, filed Jul. 16, 2015, which applications are incorporated herein by reference in their entirety.

FIELD OF THE INVENTION

The present disclosure relates to a method and related mobile device for fast blind decoding. The present invention specifically relates to a method and related mobile device for fast blind decoding of a physical layer control channel, even more specifically of a physical broadcast control channel (PBCH) in a decoder of a Long Term Evolution (LTE) compliant system. Particularly, a method for detecting a Master Information Block (MIB) is presented.

BACKGROUND OF THE INVENTION

In a cellular network, a supplied area is split into cells, each cell being equipped with a base station which serves the mobile stations in that cell. Each cell needs to be uniquely identified if a mobile devices wishes to connect to a cell or if the mobile device is already connected to a cell and wishes to connect to another cell. Cell search/detection is an important procedure for a mobile device deployed in a cellular network. Typically, reference signals are used to identify a cell which needs to be detected by the mobile device during operation. Reference signals are data symbols which are known at the receiver and are used for parameter estimation tasks, e.g. cell-identity (cell-ID) detection.

Apart from reference signals, a control channel such as PBCH is applied in a mobile device and is used for cell selection/re-selection purposes and handover procedures before camping on a cell of the cellular network. In order to gain initial access to an LTE network for example, after completing initial cell synchronization, the mobile device reads the MIB contained in the PBCH. The MIB carries a relatively small amount of important information for the initial access of the mobile device. The MIB is a 24 bit information containing 3 bits for the downlink channel bandwidth in term of resource blocks (RBs), 3 bits for the PHICH (Physical Hybrid-Automatic-Repeat-request Indicator Channel) configuration including PHICH duration and PHICH resource and a System Frame Number (SFN).

The mobile device can obtain an MIB via decoding only after detecting two types of information. As the two types of information are contained in the received PBCH itself, a blind decoding method must be applied which performs all decoding operations in consideration of all possible hypotheses with respect to the two types of information and finds hypotheses having no error in a cyclic redundancy check (CRC). The two types of information is the number of transmit antennas and the transmission frame number on which descrambling operation required for decoding depends on. The number of transmit antennas per frame is three. The total number of times that blind descrambling is required to detect the transmission frame number is four. The transmission frame number relates to the SFN by a modulus four operation, as the same scrambling sequence is applied to every fourth radio frame at the transmitter side.

This results in a total of 12 hypotheses for the blind decoding. Each of the 12 hypotheses may be evaluated by a CRC which itself requires channel decoding, i.e. convolutional decoding, of the PBCH. Convolutional decoding is by far the most computation extensive part. Hence, convolutional decoding must be performed up to 12 times which equals the total number of hypotheses. This consumes power and time.

Hence, what is needed is a solution reduces the blind decoding time.

DISCLOSURE OF THE INVENTION

This solution is achieved with a method according to the independent method claim and a related mobile device according to the independent apparatus claim. Dependent claims relate to further aspects of the present solution.

BRIEF DESCRIPTION OF THE DRAWINGS

The method and related mobile device according to the invention are described in more detail herein below by way of exemplary embodiments and with reference to the attached drawings, in which:

FIG. 5 shows a block diagram of fast PBCH blind decoding procedure.

DETAILED DESCRIPTION OF THE INVENTION

Figure 1:
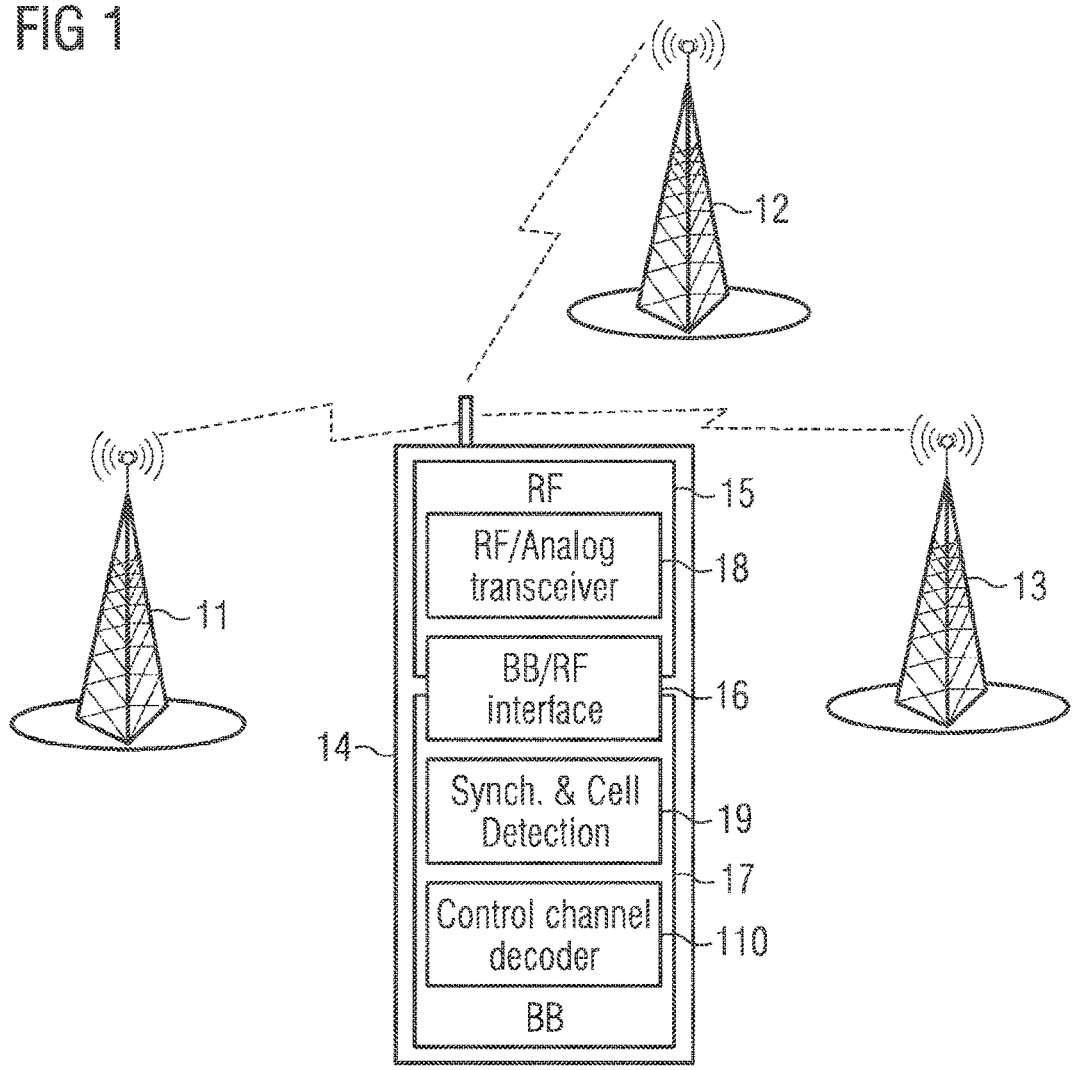
FIG. 1 shows a block diagram of a mobile device in a mobile communication system.

FIG. 1 shows a mobile communication system comprising three base stations 11, 12, 13 and a mobile device 14. When powering up the mobile device 14 has no knowledge about the deployment of the base stations 11, 12, 13, hence the number of cells surrounding the mobile device 14. If the mobile device 14 wishes to attach to a cell the mobile device 14 performs an initial cell search procedure. For example, an LTE compliant base station transmits a cell identity (cell-ID) within the Primary Synchronization Signal (PSS) and Secondary Synchronization Signal (SSS) for this purpose.

The mobile device 14 comprises a radio frequency module 15 including a radio frequency/analog transceiver 18 for acquiring radio samples from the base stations 11, 12, 13. Radio samples are transferred from the radio frequency (RF) module 15 to the base band (BB) processing module 17 via BB/RF interface 16. Part of the BB processing module 17 is the synchronization and cell detection module 19 that is configured to perform the initial cell search procedure. In an LTE system, the initial cell search procedure includes PSS detection and SSS detection. PSS detection is used for slot timing detection and physical layer ID detection. SSS detection is used for radio frame detection, cyclic prefix (CP) length detection and TDD/FDD detection.

The BB module 17 further comprises a control channel decoder 110 that is arranged subsequently to the synchronization and cell detection module 19 or may be a part of it. In an LTE system the control channel decoder 110 decodes a physical layer control channel called PBCH on downlink. The PBCH contains important information for cell selection called MIB.

Figure 2:
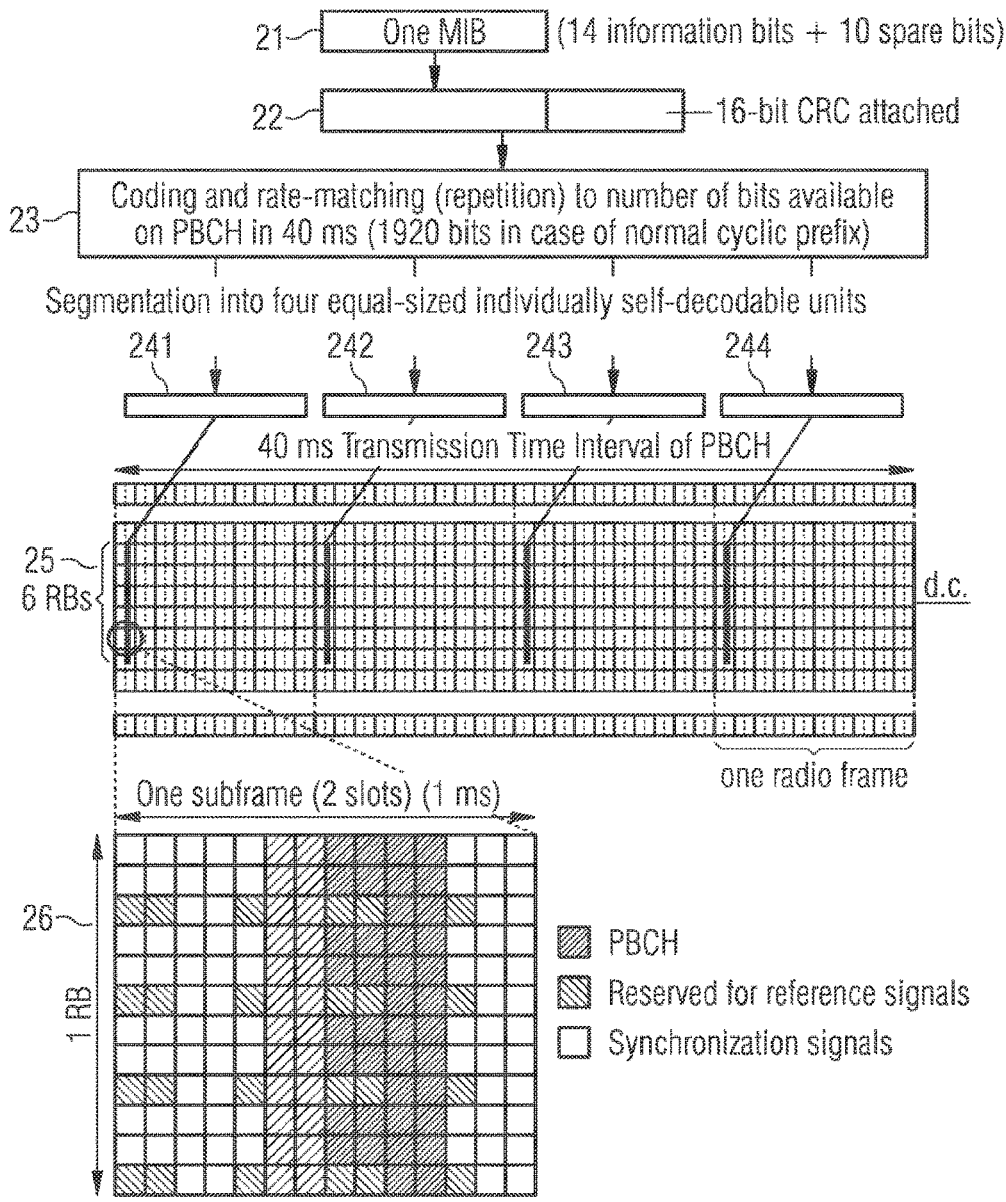
FIG. 2 shows a PBCH structure.

FIG. 2 shows the PBCH structure (source: Stefania Sesia, Issam Toufik, Matthew Baker: "LTE—The UMTS Long Term Evolution from Theory to Practice, Wiley).

MIB 21 contains 14 information bits and 10 spare bits. In the CRC generation stage 22 a 16 bit CRC is generated and scrambled with an antenna specific mask. In the convolutional encoding and rate matching stage 23 a tail biting convolutional encoding is performed over the 40 bits and the output is three streams bits each. The streams are rate matched which is merely a repetition coding, where the three streams of size 120 bits (40×3 bits) is repeated 16 times to get 1920 bits. These 1920 bits are scrambled with a scrambling sequence as long as 1920 bits.

These 1920 bits are segmented into four equal-sized individually self-decodable units 241, 242, 243 and 244 and distributed to the LTE time-frequency resource grid 25 by QPSK (quaternary phase shift keying) modulation in which they each correspond to a transmission frame number 0, 1, 2, 3 which can be identified by a modulus four operation of the SFN of the corresponding radio frame. The PBCH is mapped only to the central 72 subcarriers of an Orthogonal Frequency Division Multiplex (OFDM) signal which correspond the minimum possible LTE system bandwidth of six Resource Blocks (RBs) as shown in radio frame 26. Thus, knowledge of the system bandwidth is not required for decoding the PBCH.

The transmission periodicity is the duration between consecutive PBCH transmissions by the physical layer. The physical layer transmits the PBCH for every 10 milliseconds. The generation periodicity is the duration between two consecutive MIB. This periodicity is 40 milliseconds. Thus, the contents within 4 consecutive PBCH will remain the same as the PBCH carries the MIB and the MIB can change only after 40 milliseconds. However, as the 1920 bits of the PBCH have been scrambled prior to segmentation, the descrambler needs to blindly detect the transmission frame number (0,1,2,3) in order to descramble the individually self-decodable units as the SFN from which the transmission frame number is deducible is contained within the MIB but not detectable prior to descrambling. The de-scrambler needs to apply the correct descrambling sequence which corresponds to the transmission frame number. Moreover, the number of transmit antennas needs to be blindly detected.

Figure 3:
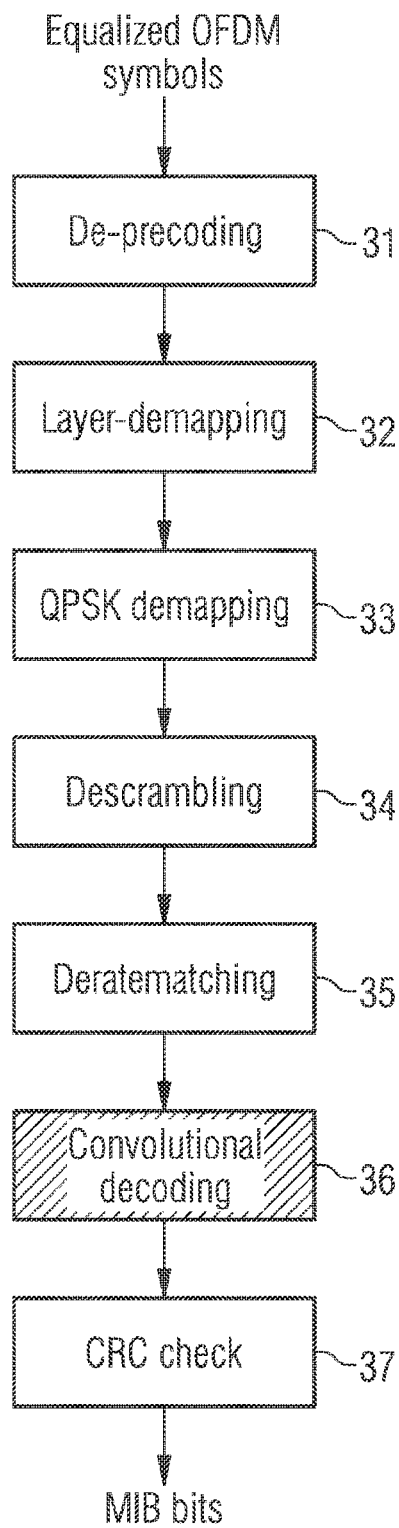
FIG. 3 shows a block diagram of a PBCH decoding procedure.

FIG. 3 shows a standard PBCH decoding structure which is performed by the control channel decoder 110 of FIG. 1. The decoding structure comprises the following stages: de-precoding 31, layer-demapping 32, QPSK demapping 33, descrambling 34, de-ratematching 35, convolutional decoding 36 and CRC 37. The decoding structure shown in FIG. 3 basically reverses the PBCH generation shown in and explained with reference to FIG. 2. For the de-precoding 31 the number of transmit antennas needs to he known but is not available to the mobile device, thus needs to be blindly detected. For the descrambler 34 the transmission frame number needs to be known but is not available to the mobile device, thus also needs to be blindly detected. The three hypotheses for the number of transmit antennas and the four hypotheses for the transmission frame number result in total in 12 hypotheses. All 12 hypotheses have to be tried iteratively until the CRC 37 passes. The decoding procedure is described in more detail in FIG. 4. Part of each PBCH decoding procedure and consequently part of each hypothesis test is the convolutional decoding 36 which is computation extensive.

Figure 4:
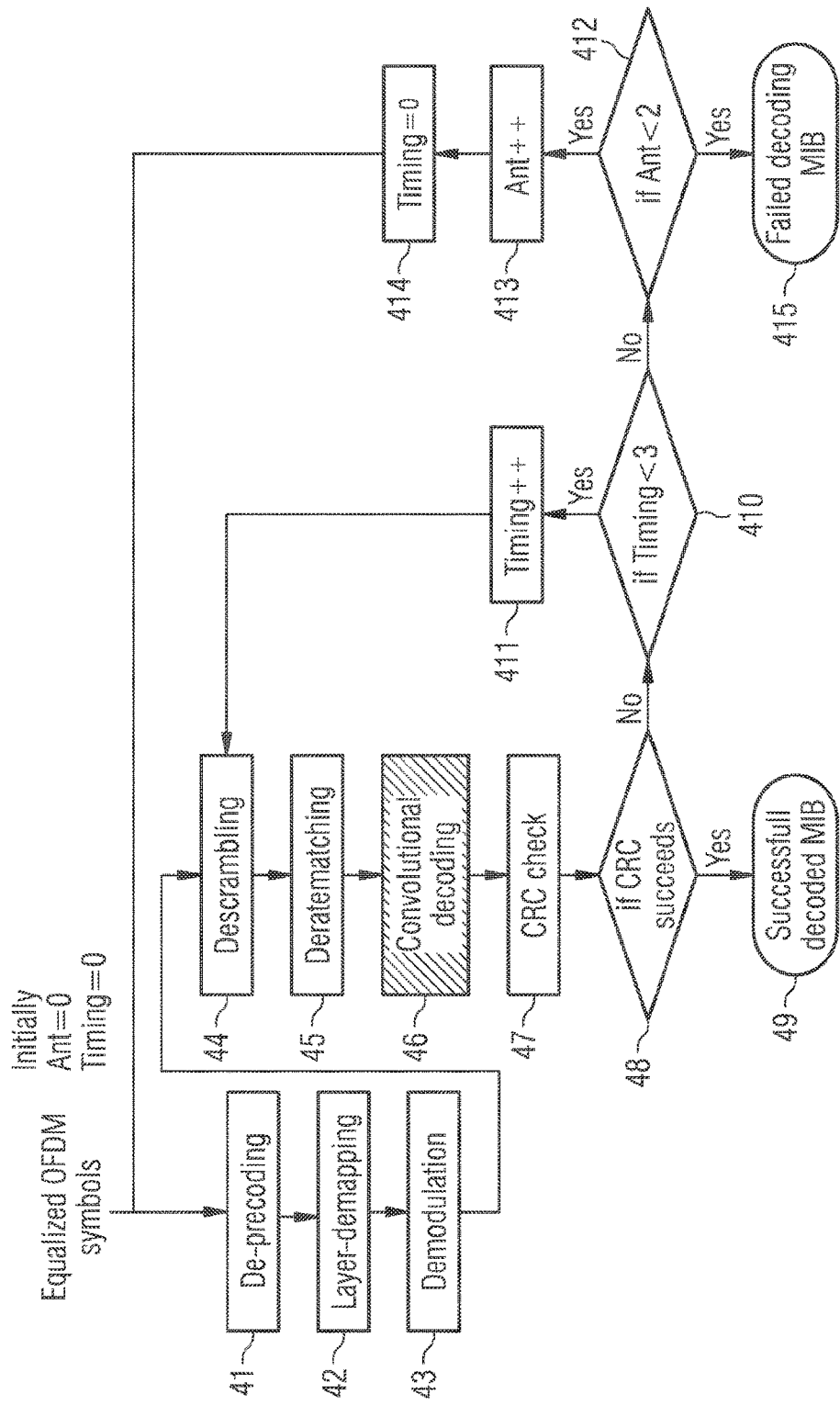
FIG. 4 shows a block diagram of a classical PBCH blind decoding procedure.

FIG. 4 shows classical PBCH blind decoding in more detail. The blind decoding procedure tests a plurality of hypotheses for the decoder. Each hypothesis is a combination of the number of antennas required for de-precoding stage 41 and timing, i.e. transmission frame number required for de-scrambling stage 44. The blind decoding consists of an outer loop for blindly detecting the number of transmit antennas and an inner loop for blindly detecting the timing. The inner loop comprises descrambling stage 44, de-ratematching stage 45, convolutional decoding stage 46 and CRC check stage 47 and is performed for a specific number of transmit antennas. The outer loop further comprises de-precoding stage 41, layer demapping stage 42 and demodulation stage 43.

Initially, the control channel decoder sets a counter for the antenna hypotheses {1,2,4} according to 3GPP TS 36.211 chapter 6.6.3 and a counter for the timing hypotheses to zero. This is the first hypothesis to be tested. When all decoding stages 41-47 have been passed, the control channel decoder checks in decision stage 48 whether the CRC 47 succeeds or not. If the CRC succeeds, the MIB is deemed to be successfully detected. If the CRC does not succeed, the control channel coder checks in decision stage 410 whether the total number of hypotheses for the timing has been tested. If this is not the case, a next hypothesis for the timing is set in stage 411 and tested in the inner loop. Again, at the end of the inner loop, the control channel decoder checks whether the CRC succeeds or not in decision stage 48. If this is not the case, the inner loop repeats for a next hypothesis for the timing. If all hypothesis for the timing have been tested for a specific hypothesis for the number of transmit antennas and CRC did not succeed, the blind PBCH decoding procedures continues at decision stage 412 where the control channel checks whether the total number of hypotheses for the number of transmit antennas have already been tested. If this is not the case, a next hypothesis for the number of transmit antennas is set in stage 413 and the counter for the timing hypotheses is set to zero in stage 414, so as to reset the inner loop. Then the control channel decoder tests the next hypothesis for the number of transmit antennas. It starts with de-precoding 41 given the hypothesis for the number of transmit antennas and continues to CRC 47 and may continue by entering the inner loop. If CRC 47 succeeds, then the PBCH decoding procedure ends at stage 49. Then MIB decoding has been successful. If after having tested all 12 hypotheses, CRC 47 fails, then the PBCH decoding procedure ends at stage 415.Then MIB decoding has failed. It can he observed that the control channel decoder has to perform channel decoding, i.e. convolutional decoding in each loop. In a worst case, it has to be performed 12 times before it is determined whether MIB decoding can be successfully completed or not. As convolutional decoding is computationally expensive, it is an objective of the present disclosure to overcome this problem not only for PBCH decoding, but for any blind decoding involving decoding hypotheses to be tested and further channel decoding.

The present disclosure relates to a method for blind decoding a signal in a decoder of a mobile device. The method comprises receiving a channel coded signal; testing a plurality of hypotheses for the decoder that are not related to channel decoding by for each of the hypotheses, generating a test result by decoding the channel coded signal to generate a hypothesis specific decoded, yet still channel coded signal and correlating a local channel coded reference sequence against a presumed corresponding section of the hypothesis specific decoded, yet still channel coded signal. The method further comprises determining a best hypothesis based on the test results and generating a channel decoded signal by channel decoding a hypothesis specific decoded, yet still channel coded signal associated with the best hypothesis.

Note, the method clearly distinguishes blind decoding from channel decoding. Hypotheses to be tested for blind decoding can be any hypotheses of the decoder that do not relate to channel decoding.

As all hypotheses have been tested before channel decoding, e.g. convolutional decoding, is performed, channel decoding needs to performed only once irrespective of the number of hypotheses to be tested. As channel decoding is computationally expensive, the method disclosed herein saves a lot of time and power compared to classical blind decoding.

A channel coded signal can be a channel coded physical layer control channel such as a PBCH in an LTE system. For the PBCH, a hypothesis to be tested is a combination of the number of transmit antennas required for de-precoding the channel coded signal and a timing, specifically a transmission frame number, required for descrambling a de-precoded channel coded signal. In a synchronized network, the timing, for example the SFN may be known a priori. Then the hypothesis testing reduces to the number of transmit antennas.

The method may comprise checking the decoded signal for errors, e.g. by a CRC. When still errors have been determined, the remaining hypotheses may be tested with the classical approach, i.e. channel decoding and subsequent CRC for each of the remaining hypotheses.

One aspect of the present solution relates to the local channel coded reference sequence which is used to correlate against a presumed corresponding section of the hypothesis specific decoded, channel coded signal for each of the plurality of hypotheses. For PBCH decoding this reference sequence may the known spare bits of the MIB. The MIB contains 14 information bits and 10 spare bits. Now referring back to FIG. 2, after CRC attachment the positions of the known spare bits are [14 . . . 23]. After convolutional encoding the message bits are represented by three parity bit sequence. The known spare bits are uniquely mapped to corresponding sections in the parity sequences. Thus, they can be determined taking into account the window of the convolutional encoder. Let x denote an unknown bit, S denote a known spare bit, [denote the lower boundary of the window and] denote the upper boundary of the window in the following bit sequence: xxxx[SSSSSSS]SSSxxx. The window of convolutional encoder slides along the bit sequence in the encoding process. Each position of the window which contains 7 direct subsequent spare bits produces a known bit in each of the three resulting parity bit sequences. This results in 4*3=12 known bits in the parity bit sequences. Those bits are located at positions [20 . . . 23] in each parity bit sequence and can thus be uniquely identified within each PBCH and consequently form a presumed corresponding section of the PBCH against its local copy can be correlated in the mobile device.

One aspect of the present disclosure relates to correlating the local channel coded reference sequence against the presumed corresponding section of the hypothesis specific decoded, channel coded signal. Correlating may be performed by computing the Euclidian distance between the local channel coded reference sequence and the presumed corresponding section of the hypothesis specific decoded channel decoded signal. The hypothesis with the lowest Euclidian distance may be chosen to be the best hypothesis, i.e. to be the most likelihood one and to be channel decoded afterwards.

FIG. 5 shows a fast PBCH blind decoding procedure as an example of the proposed fast blind decoding method. Control channel decoder 110 shown in FIG. 1 performs this procedure. The blind decoding procedure tests a plurality of hypotheses for the decoder. Each hypothesis is a combination of number of antennas used for de-precoding stage 51 and timing, i.e. transmission frame number used for de-scrambling stage 54. The blind decoding consists of an outer loop for blindly detecting the number of transmit antennas and an inner loop for blindly detecting the timing. The inner loop comprises descrambling stage 54, de-ratematching stage 55, and correlation stage 56 that computes the Euclidian distance between the channel coded reference sequence represented by the known bits of the MIB and the presumed corresponding section of the de-precoded, descrambled, yet still channel coded signal. The inner loop is performed for a specific number of transmit antennas. The outer loop further comprises de-precoding stage 51, layer demapping stage 52 and demodulation stage 53.

Initially, the control channel decoder sets a counter for the antenna hypotheses {1,2,4} according to 3GPP TS 36.211 chapter 6.6.3 and a counter for the timing hypotheses to zero. This is the first hypothesis to be tested. When all decoding stages 51-56 have been passed, the control channel decoder checks in decision stage 57 whether the total number of hypotheses for the timing have been tested. If this is not the case, a next hypothesis for the timing is set in stage 58 and tested in the inner loop. Again, at the end of the inner loop, the control channel decoder checks whether all hypotheses for the timing have been tested. If this is not the case, the inner loop repeats for a next hypothesis for the timing. When all hypothesis for the timing have been tested for a specific number of transmit antennas, the control channel checks whether the total number of hypotheses for the number of transmit antennas have already been tested in decision stage 59. If this is not the case, a next hypothesis for the number of transmit antennas is set in stage 510 and the counter for the timing hypotheses is set to zero in stage 511, so as to reset the inner loop. Then the control channel decoder tests the next hypothesis for the number of transmit antennas. It starts with de-precoding 51 given the hypothesis for the number of transmit antennas and continues to performing the inner loop for a number of times determined in decision stage 57 and ends at decision stage 59.

When the control channel decoder decides in decision stage 59 that all hypotheses for the number of transmit antennas, hence in combination with the inner loop all hypotheses for the combination of number of transmit antennas and timing have been tested, then it continuous to stage 512. In stage 512 the control channel decoder chooses the best hypothesis. This is the hypothesis having the lowest Euclidian distance as computed in stage 56. Up to this point, no channel decoding, i.e. convolutional decoding had to be performed. Still at this point, the control channel decoder was able to determine a hypothesis having the highest likelihood of being correct. Once the control channel decoder has determined the best hypothesis in stage 512, it performs convolutional decoding in stage 513 for the PBCH only for said best hypothesis, hence only once. It contrast to classical PBCH decoding this saves time and power. The subsequent CRC in stage 514 indicates whether the best hypothesis has been correct or not. If this is the case, the MIB is deemed to be successfully decoded as indicated by stage 515. If this, however, is not the case, then the hypothesis having the highest likelihood of being correct turned out to be not correct. Then classical PBCH decoding comprising channel decoding for each of the plurality of hypotheses can be performed as indicated by stage 516. Alternatively and in situations in which the hypothesis having the highest likelihood of being correct turns out to be incorrect, the procedure of FIG. 5 may loop back to stage 512 and the control channel decoder may choose the next-best hypothesis. The next-best hypothesis may then be convolutionally decoded in stage 513 to determine, in stage 514, whether the next-best hypothesis is correct. This procedure may repeat in a loop moving down the hypotheses in order of likelihood until one of the hypotheses is identified as being correct.

The presented disclosure further relates to a computer readable medium having computer-executable instructions for performing the method of blind decoding disclosed herein.

The present disclosure further relates to a mobile device as shown in FIG. 1. The mobile device comprises a receiver configured to receive a channel coded signal a control channel decoder configured to test a plurality of hypotheses for the control channel decoder by for each of the plurality of hypotheses generating a test result by decoding the channel coded signal to generate a hypothesis specific decoded, yet still channel coded signal and by correlating a local channel coded reference sequence against a presumed corresponding section of the hypothesis specific decoded, yet still channel coded signal. The control channel decoder is further configured to determine a best hypothesis based on the test results. The control channel decoder comprises a channel decoder configured generate a channel decoded signal by channel decoding a hypothesis specific decoded, yet still channel coded signal associated with the best hypothesis. The control channel decoder may be PBCH decoder. The channel decoder may be a convolutional decoder.

What is claimed is:

1. A method for blind decoding a signal in a decoder of a mobile device, the method comprising:
   receiving a channel coded signal;
   testing a plurality of hypotheses for blind decoding not related to channel decoding by:
   for each of the hypotheses, generating a test result by decoding the channel coded signal to generate a hypothesis specific decoded signal and correlating a local channel coded reference sequence against a presumed corresponding section of the hypothesis specific decoded signal;
   determining a best hypothesis based on the test results; and
   generating a channel decoded signal by channel decoding the hypothesis specific decoded signal associated with the best hypothesis.

2. The method according to claim 1 further comprising:
   checking the channel decoded signal for errors; and in response to detecting one or more errors, testing at least one of the remaining hypotheses by channel decoding the hypothesis specific decoded signal associated with the at least one of the remaining hypotheses.

3. The method according to claim 2, wherein checking the decoded signal for errors comprises:
   applying a cyclic redundancy check (CRC) to the channel decoded signal.

4. The method according to claim 3, wherein a hypothesis of the plurality of hypotheses is a number of transmit antennas required for de-precoding the channel coded signal.

5. The method according to claim 3, wherein a hypothesis of the plurality of hypotheses is a timing of the channel coded signal required for descrambling a de-precoded channel coded signal.

6. The method according to claim 3, wherein each hypothesis of the plurality of hypotheses is a combination of a number of transmit antennas used for de-precoding the channel coded signal and a timing of the channel coded signal used for descrambling a de-precoded channel coded signal.

7. The method according to claim 6, wherein the channel coded signal is a Long Term Evolution (LTE) compliant signal and wherein the timing is a transmission frame number.

8. The method according to claim 6 wherein testing the plurality of hypotheses for blind decoding comprises:
   for each hypothesis of the number of transmit antennas:
      de-precoding a stream of channel encoded orthogonal frequency division modulation (OFDM) symbols by applying a hypothesis of a specific number of transmit antennas;
      layer de-mapping and demodulating a resulting de-precoded stream; and
   for each hypothesis of the timing:
      de-scrambling a resulting demodulated stream by applying a hypothesis for a specific timing;
      de-ratematching a resulting demodulated stream.

9. The method according to claim 8, wherein the channel coded signal is a Long Term Evolution (LTE) compliant convolutional coded signal.

10. The method according to claim 9, wherein the LTE compliant convolutional coded signal is a physical broadcast channel (PBCH).

11. The method according to claim 10, wherein the reference sequence is a number of direct subsequent spare bits of a master information block (MIB) of the physical broadcast channel (PBCH).

12. The method according to claim 11, wherein the channel coded signal is a convolutional coded signal and wherein the number of direct subsequent spare bits is not smaller than a window of a corresponding convolutional encoder which guarantees an unambiguous recovery of a corresponding parity signal.

13. The method according to claim 12, wherein the number of direct subsequent spare bits is any of the following: seven, eight, nine, or ten.

14. The method according to claim 1, wherein correlating a local channel coded reference sequence against a presumed corresponding section of the hypothesis specific decoded channel coded signal comprises determining an Euclidian distance between the local channel coded reference sequence and the presumed corresponding section of the hypothesis specific decoded channel decoded signal.

15. The method according to claim 1, wherein the channel coded signal is a convolutional coded signal, wherein the hypothesis specific decoded signal is a hypothesis specific decoded, convolutional coded signal; and wherein channel decoding comprises convolutional decoding.

16. A mobile device comprising:
   means for receiving a channel coded signal;
   means for testing a plurality of hypotheses for blind decoding not related to channel decoding by for each of the hypotheses, generating a test result by decoding the channel coded signal to generate a hypothesis specific decoded signal and correlating a local channel coded reference sequence against a presumed corresponding section of the hypothesis specific decoded signal;

means for determining a best hypothesis based on the test results; and means for generating a channel decoded signal by channel decoding a hypothesis specific decoded signal associated with the best hypothesis.

17. The mobile device according to claim 16, further comprising means for checking the decoded signal for errors.

18. The mobile device according to claim 16, the mobile device comprising:

a receiver configured to receive a channel coded signal;

a control channel decoder configured to test a plurality of hypotheses for the control channel decoder by generating, for each of the hypotheses, a test result by decoding the channel coded signal to generate a hypothesis specific decoded signal and by correlating a local channel coded reference sequence against a presumed corresponding section of the hypothesis specific decoded signal;

the control channel being further configured to determine a best hypothesis based on the test results;

the control channel decoder comprising a channel decoder configured to generate a channel coded signal by channel decoding a hypothesis specific decoded signal associated with the best hypothesis.

19. The mobile device according to claim 16 comprising:

a receiver configured to receive a convolutional coded signal;

a physical broadcast control channel (PBCH) decoder configured to test a plurality of hypotheses for the PBCH decoder by generating, for each of the hypotheses, a test result by decoding the convolutional coded signal to generate a hypothesis specific decoded, yet still convolutional coded signal and by correlating a number of convolutional coded spare bits of a master information block MIB of a PBCH against a presumed corresponding section of the hypothesis specific decoded, yet still convolutional coded signal;

the PBCH decoder being further configured to determine a best hypothesis based on the test results;

the PBCH decoder further comprising a convolutional decoder configured to generate a channel decoded signal by convolutional decoding a hypothesis specific decoded, yet still convolutional coded signal for the best hypothesis to generate a channel decoded signal.

20. The mobile device according to claim 19 wherein each hypothesis of the plurality of hypotheses is a combination of a number of transmit antennas represented by a pre-coding matrix used for de-preceding the convolutional coded signal and a timing to enable a timing recovery of the LTE compliant device represented by a modulus 4 operation of a system frame number (SFN).

21. A non-transitory computer readable medium having computer-executable instructions for performing the method according to claim 1.

\* \* \* \* \*